United States Patent
Hofmann et al.

(10) Patent No.: US 6,265,748 B1
(45) Date of Patent: Jul. 24, 2001

(54) STORAGE CELL ARRANGEMENT IN WHICH VERTICAL MOS TRANSISTORS HAVE AT LEAST THREE DIFFERENT THRESHOLD VOLTAGES DEPENDING ON STORED DATA, AND METHOD OF PRODUCING SAID ARRANGEMENT

(75) Inventors: Franz Hofmann, München; Wolfgang Krautschneider, Hohenthann; Josef Willer, Riemerling, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/180,129

(22) PCT Filed: Apr. 9, 1997

(86) PCT No.: PCT/DE97/00720

§ 371 Date: Nov. 2, 1998

§ 102(e) Date: Nov. 2, 1998

(87) PCT Pub. No.: WO97/42660

PCT Pub. Date: Nov. 13, 1997

(30) Foreign Application Priority Data

May 2, 1996 (DE) ............................................... 196 17 646

(51) Int. Cl.[7] ........................... H01L 29/76; H01L 29/94; H01L 31/062; H01L 31/113; H01L 31/119
(52) U.S. Cl. ............................................. 257/390; 257/391
(58) Field of Search .................................... 257/390, 391, 257/392, 404, 330; 438/275, 276

(56) References Cited

U.S. PATENT DOCUMENTS

| | | | |
|---|---|---|---|
| 4,663,644 | 5/1987 | Shimizu | 257/331 |
| 5,300,804 | * 4/1994 | Arai | 257/332 |
| 5,386,381 | 1/1995 | Takizawa et al. | 257/390 |
| 5,453,637 | 9/1995 | Fong-Chun et al. | 257/390 |
| 5,973,373 | * 10/1999 | Krautschneider et al. | 257/390 |

FOREIGN PATENT DOCUMENTS

| | | |
|---|---|---|
| 42 14 923 A1 | 12/1992 | (DE) . |
| 4-226071 | 8/1992 | (JP) . |
| 2-41395 | 2/1995 | (JP) . |
| 7-169859 | 7/1995 | (JP) . |
| 2-62590 | 11/1995 | (JP) . |
| 2-70239 | 2/1996 | (JP) . |
| WO 96/10266 | 4/1996 | (WO) . |

OTHER PUBLICATIONS

IEICE Trans. Electron, vol. E77–C, No. 4, Apr. 4, 1994 pp. 601–607.

* cited by examiner

Primary Examiner—Olik Chaudhuri
Assistant Examiner—Phat X. Cao
(74) Attorney, Agent, or Firm—Schiff Hardin & Waite

(57) ABSTRACT

A memory cell arrangement, and method for producing same, which includes vertical MOS transistors as memory cells wherein the information is stored by means of at least three different threshold voltage values of the transistors by multi-level programming. One threshold voltage value is obtained by the thickness of the gate dielectric in the sense of a thick oxide transistor and the other threshold voltage values are obtained by different channel dopings. The arrangement can be produced with an area requirement for each memory cell of 2 $F^2$ (F: minimum structure size).

3 Claims, 6 Drawing Sheets

STORAGE CELL ARRANGEMENT IN WHICH VERTICAL MOS TRANSISTORS HAVE AT LEAST THREE DIFFERENT THRESHOLD VOLTAGES DEPENDING ON STORED DATA, AND METHOD OF PRODUCING SAID ARRANGEMENT

BACKGROUND OF THE INVENTION

1. Field of the Invention

The present invention relates, generally, to a memory cell arrangement wherein the associated memory cells each include an MOS transistor which is vertical with respect to a main area of a substrate and, more particularly, to a memory cell arrangement wherein individual memory cells each include an MOS transistor vertically positioned with respect to a substrate and which possesses at least three threshold voltage values depending on the information stored therein.

2. Description of the Prior Art

In order to store large volumes of data, for example for DP (data processing) applications or for the digital storage of music or images, use is typically made of memory systems which have mechanically movable parts such as, for example, hard disk memories, floppy disks or compact discs. The moved parts are subject to mechanical wear. Furthermore, they require a comparatively large volume and permit only slow data access. Moreover, since they are sensitive to vibrations and position and have a comparatively high power consumption for their operation, these memory systems can be used in mobile systems only to a limited extent.

In order to store relatively small volumes of data, semiconductor-based read-only memories are known. These are often in the form of a planar integrated silicon circuit in which MOS transistors are used as memory cells. The transistors are selected via the gate electrode which is connected to the word line. The input of the MOS transistor is connected to a reference line and the output is connected to a bit line. During the read operation, it is assessed whether or not a current is flowing through the transistor. The logic values zero and one are assigned correspondingly. The storage of zero and one is effected in technical terms in that no MOS transistor is produced, or no conductive connection to the bit line is formed, in memory cells in which the logic value assigned to the state "no current flow through the transistor" is stored. As an alternative, MOS transistors which have different threshold voltages due to different dopant concentrations in the channel region can be formed for the two logic values.

These semiconductor-based memories permit random access to the stored information. The electrical power required to read the information is distinctly less than in the case of the abovementioned memory systems having mechanically movable parts. Since no movable parts are required, mechanical wear and sensitivity to vibrations are no longer a problem. Semiconductor-based memories can be used for mobile systems as well.

The silicon memories described generally have a planar structure. A minimum area requirement thus becomes necessary for each memory cell. Such requirement is $4 F^2$ in the most favorable case, wherein F being the smallest structure size that can be produced with the respective technology.

A read-only memory cell arrangement whose memory cells include MOS transistors is disclosed in German Patent document DE 42 14 923 A1. These MOS transistors are arranged along trenches in such a way that a source region adjoins the bottom of the trench, a drain region adjoins the surface of the substrate and a channel region adjoins the side and bottom of the trench both vertically with respect to the surface of the substrate and parallel to the surface of the substrate. The surface of the channel region is provided with a gate dielectric. The gate electrode is designed as a side covering (spacer). The logic values zero and one are differentiated by different threshold voltages which are effected by channel implantation. During the channel implantation, the implanting ions impinge on the surface of the respective trench at an angle such that implantation is deliberately effected only along one side due to shading effects of the opposite side. In this memory cell arrangement, the word lines run as spacers along the sides of the trenches.

Japanese Patent document JP-A 4-226071 discloses a further memory cell arrangement which include vertical MOS transistors arranged on the sides of trenches as memory cells. In this case, diffusion regions, which in each case form the source/drain regions of the vertical MOS transistors, run on the bottom of trenches and between adjacent trenches. The word lines, which include the gate electrodes of the vertical MOS transistors, run perpendicularly to the trenches. The threshold voltage of the vertical MOS transistors is set by means of angled implantation.

U.S. Pat. No. 4,663,644 discloses a memory cell arrangement whose memory cells include vertical MOS transistors. These vertical NOS transistors are each arranged on the sides of trenches. The word lines, which each include the gate electrodes of the vertical MOS transistors, are arranged in the trenches. Two word lines are arranged in each trench. The bit lines are formed as conductor tracks on the surface of the substrate. The contact between the bit lines and the respective source/drain regions which adjoin the surface of the substrate is formed via a contact hole. The source/drain regions which adjoin the bottom of the trenches are formed as a continuous doped layer and are put at the reference potential. In this memory cell arrangement, the information is stored in the form of threshold voltages, having different levels, of the MOS transistors. The different threshold voltages are obtained by different dopant concentrations in the channel region of the MOS transistors. In order to form an increased dopant concentration in the channel region, a doped layer is deposited and is structured in such a way that sides in which increased dopant concentrations are to be formed remain covered by the structured dopant layer. The channel regions having an increased dopant concentration are formed by outdiffusion of the structured dopant layer.

In order to increase the effective storage density, it has furthermore been proposed (see, for example, the publication by Yasushi Kubota, Shinji Toyoyama, Yoji Kanic, Shuhei Tsuchimoto "Proposal of New Multiple-Valued Mask-ROM Design" IEICE Trans. Electron Vol. E77, p. 601, April 1994), to program a semiconductor memory arrangement having planar MOS transistors in the sense of multi-value logic. This procedure is also referred to as multi-level programming. In this case, the MOS transistors are produced in such a way that they have four different threshold voltage values depending on the stored information. Each of the threshold voltage values is then assigned two logic values, that is to say "0" and "0", "0" and "1", "1" and "0" or "1" and "1". In this way, the effective storage density risen by a factor of two since two logic values are stored in each memory cell without the area of the memory cell changing as a result. The different threshold voltage values are obtained by different channel dopings. Masked implantation is carried out for each threshold voltage value.

Four additional masks are therefore necessary for multi-level programming.

SUMMARY OF THE INVENTION

The present invention is thereof directed to specifying a semiconductor-based memory cell arrangement in which an increased storage density in achieved and which can be produced with both few production steps and a high yield. Furthermore, it is intended to specify a method for the production of such a memory cell arrangement.

In the memory cell arrangement according to the present invention, memory calls which each comprise an MOS transistor which is vertical with respect to the main area are provided in a substrate. A substrate made of monocrystalline silicon or the silicon layer of an SOI substrate is preferably used as the substrate. The vertical MOS transistors each have one of at least three threshold voltage values depending on the stored information. The memory cell arrangement is programmed in the sense of multi-value logic.

One of the different threshold voltage values is obtained by virtue of the fact that the corresponding MOS transistors have a gate dielectric having a thickness differing from the other MOS transistors. The thickness of the gate dielectric is preferably greater than in the other MOS transistors, with the result that a thick oxide transistor is formed. The remaining threshold voltage values are obtained by different channel dopings.

$2^n$ threshold voltages, where n>1, are preferably obtained since n logic values are then stored in each memory cell.

Strip-like trenches which essentially run in parallel are preferably provided in the substrate. Strip-like doped regions, which are doped by a second conductivity type which is opposite to the first, are arranged on the bottom of the trenches and on the main area between adjacent trenches. Gate dielectrics are in each case arranged on the sides of the trenches. Word lines are provided which run transversely with respect to the trenches and include gate electrodes for the vertical MOS transistors in the region of the sides of the trenches. The vertical MOS transistors are in each case formed by two strip-like, doped regions adjoining the same side of one of the trenches, such doped regions act as source/drain region wherein the trench side is arranged in between together with the gate dielectric and the part of one of the word lines is arranged thereabove. The strip-like doped regions are used as bit or reference lines during operation of the memory cell arrangement.

The spacing between adjacent trenches is preferably chosen in such a way that it is essentially equal to the width of the trenches. The spacing between adjacent word lines is likewise chosen to be equal to the width of the word lines. If the width of the trenches and the width of the word lines are chosen to correspond to the minimum structure width F in the respective technology, this produces a space requirement of 2 $F^2$ for the memory cell. If the four MOS transistors have four different threshold voltage values, then two logic values, that is to say two bits, are stored in each memory cell. The space requirement per bit is then $F^2$. If a minimum structure width of F=0.4 μm is taken as a basis and if the four MOS transistors have four different threshold voltage values, then a storage density of about 6.2 bits/$\mu m^2$ is achieved in the memory cell arrangement.

In order to produce the memory cell arrangement according to the present invention, strip-like trenches which essentially run in parallel are preferably formed in a main area of a substrate. Vertical MOS transistors are formed on the sides of the trenches with respect to the main area, these transistors act as memory cells and have at least three different threshold voltage values depending on the stored information.

Strip-like, doped regions, which are doped by a second conductivity type which is opposite to the first, are preferably formed on the bottom of the trenches and on the main area between adjacent trenches. An insulating layer is subsequently applied thereon. A first mask, which is made, for example, of photoresist and has first openings, is produced on the insulating layer. The insulating layer is structured using the first mask such that the sides of the trenches are at least partially exposed in the region of the first openings. The exposed sides are doped.

A second mask, which is made, for example, of photoresist and has second openings, is produced on the insulating layer. The insulating layer is structured using the second mask such that the sides of the trenches are at least partially exposed in the region of the second openings.

Outside the first and second openings, the sides remain covered by the structured insulating layer. The structured insulating layer acts as a thick gate dielectric in this region. A gate dielectric is formed on the sides in the region of the first and second openings.

Word lines which run transversely with respect to the trenches are subsequently formed.

The threshold voltage value is set by the doping of the exposed sides in the region of the first openings, by the doping of the substrate in the region of the second openings, and by the thickness of the insulating layer outside the first and second openings.

In order to produce more than three threshold voltage values, prior to the formation of the second mask, further masks are formed, structuring of the insulating layer are carried out and exposed sides are doped.

Since one of the threshold voltage values is set by way of the thickness of the structured insulating layer, the number of masks required for programming is smaller by one than the number of threshold voltage values.

The exposed sides are preferably doped by angled implantation. The implantation is preferably carried out at an angle of inclination in the range between 20° and 30° with respect to the normal to the main area. Angles of inclination of this type are provided as standard in many implantation installations in order to avoid the channelling effect.

As an alternative, the exposed sides are produced by outdiffusion of a doped layer. The doped layer is applied over the whole area above the structured insulating layer. The doped layer is preferably formed from doped glass, doped polysilicon or doped amorphous silicon. The use of doped glass has the advantage that the doped layer can in this case be removed selectively with respect to the substrate.

The insulating layer is preferably applied with a layer thickness such that it fills the trenches. The surface of the substrate is exposed prior to the formation of the first mask. The respective sides of the trenches are essentially completely exposed during the structuring of the insulating layer. A planar structure is obtained by the filling of the trenches. Focus problems are consequently avoided during the formation of the masks for the purpose of structuring the insulating layer. Furthermore, the variation in the individual threshold voltage values is reduced.

The trenches are preferably formed by anisotropic etching using a trench mask.

The strip-like, doped regions on the bottom of the trenches and on the main area between adjacent trenches are preferably produced by an implantation after the trench formation and after the removal of the trench mask. In this case, it is advantageous to provide the sides of the trenches with spacers prior to the implantation, wherein spacers have a masking action during the implantation. These spacers are subsequently removed. The formation of the trenches and of the strip-like, doped regions requires only one mask.

As an alternative, the strip-like, doped regions can be produced by producing a doped region on the main area, which doped region covers the entire memory cell array, before the formation of the trenches. When the trenches are opened, this doped region is subdivided into the strip-like, doped regions on the main area. The strip-like, doped regions on the bottom of the trenches are produced by ion implantation after the trenches have been opened. When using a trench mask, it is advantageous here to leave it as a mask on the main area during the implantation.

The insulating layer is preferably structured by anisotropic etching. However, the insulating layer can also be structured by combined isotropic and anisotropic etching. The etching takes place selectively with respect to the substrate.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
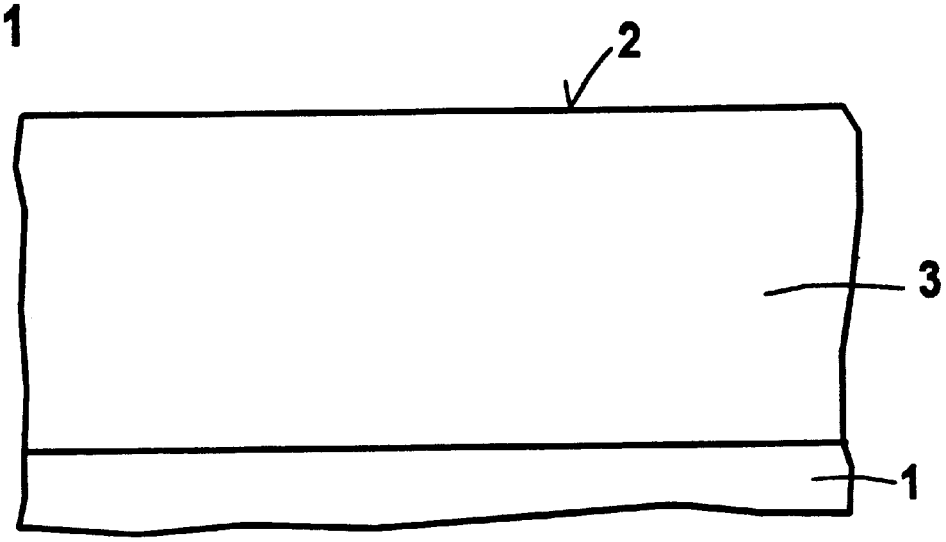
FIG. 1 shows a substrate with a well which is doped by a first conductivity type.

In a substrate 1 made, for example, of p-doped monocrystalline silicon having a dopant concentration of $5 \times 10^{15}$ $cm^{-3}$, a p-doped well 3 having a dopant concentration of $2 \times 10^{17}$ $cm^{-3}$ is produced in a main area 2 by implantation and subsequent heat treatment (see FIG. 1). During the implantation of the p-doped well 3, use is made of a screen oxide with a thickness of, for example, 50 nm (not illustrated), which is removed again after the driving in of the p-doped well 3 at 180 keV, $7 \times 10^{12}$ $cm^{-2}$. The p-doped well 3 extends at least over a region for a cell array.

An $SiO_2$ layer is deposited on the main area 2 to a layer thickness of 300 nm, for example using, also for example, a TEOS method. The $SiO_2$ layer is structured with the aid of photolithographic process steps wherein a trench mask 4 is formed. The trench mask 4 has strip-like openings which essentially run in parallel. The strip-like openings in the trench mask 4 have, for example, a width of 0.4 $\mu$m, a length of 125 $\mu$m and a spacing of 0.4 $\mu$m.

Figure 2:
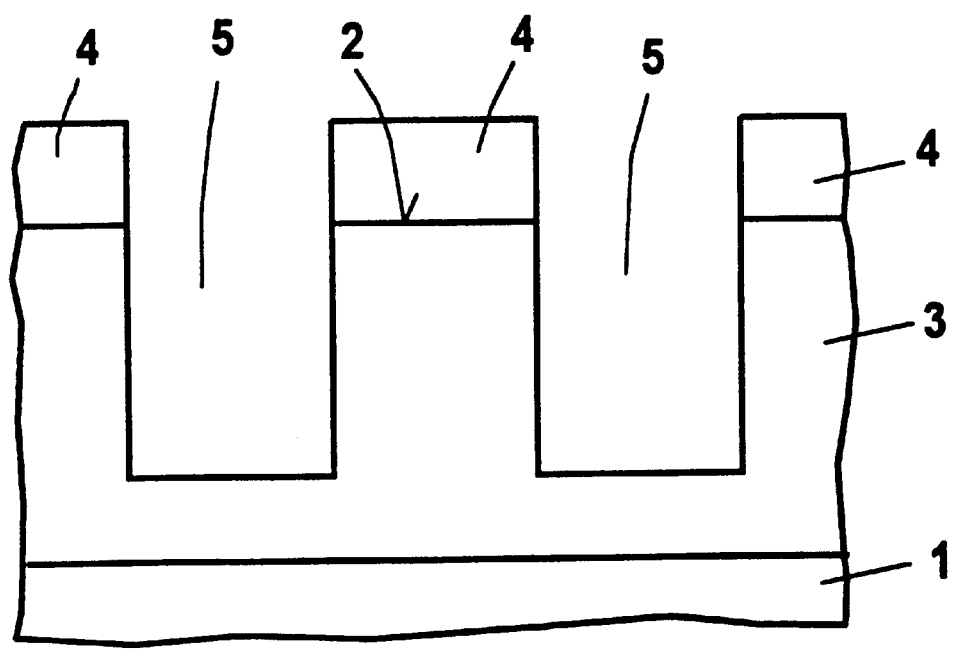
FIG. 2 shows the substrate after the etching of strip-like trenches.

Trenches 5 are etched into the main area 2 of the substrate 1 in an anisotropic etching process, for example with HBr, He, $O_2$, $NF_3$, while using the trench mask 4 as an etching mask. The trenches 5 have a strip-like cross-section corresponding to the openings in the trench mask 4 parallel to the main area 2. They have, for example, a width of 0.4 $\mu$m, a length of 125 $\mu$m and a spacing of 0.4 $\mu$m. The depth of the trenches is, for example, 0.6 $\mu$m (see FIG. 2). 32 parallel trenches 5 are formed, for example.

Figure 3:
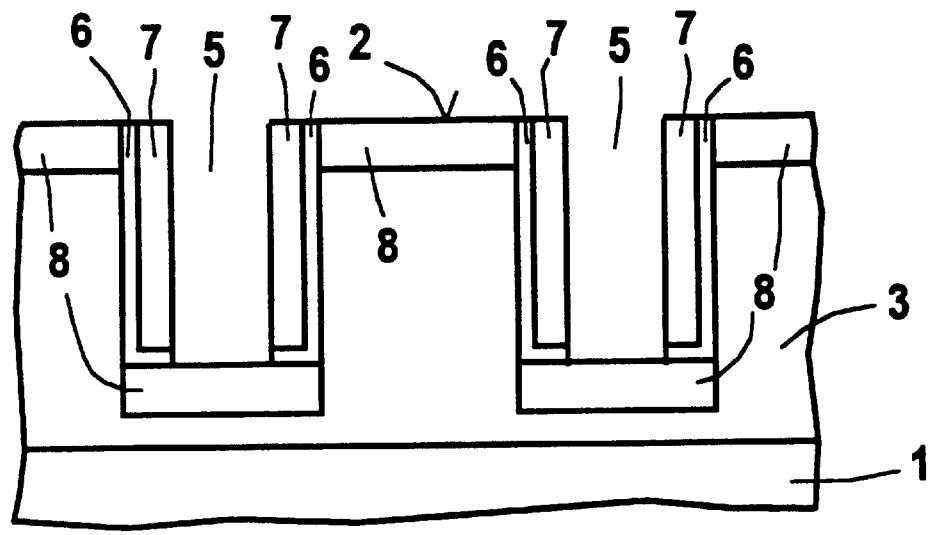
FIG. 3 shows the substrate after the formation of strip-like, doped regions on the bottoms of the trenches and between adjacent trenches on the main area of the substrate.

The trench mask 4 is subsequently stripped off using an HF dip, for example. In order to improve the quality of the crystal surfaces, an $SiO_2$ layer 6 (so-called sacrificial oxide) is produced by thermal oxidation to a thickness of, for example, 20 nm (see FIG. 3). $SiO_2$ spacers 7 are produced on vertical sides of the trenches 5 by conformal deposition, for example using a TEOS method, of an $SiO_2$ layer to a layer thickness of, for example, 60 nm and subsequent anisotropic dry etching using $CHF_3$, $O_2$ (see FIG. 3). A thin screen oxide is subsequently deposited using a TROS method (not illustrated). $n^+$-doped, strip-like regions 8 are formed on the bottom of the trenches 5 and on the main area 2 between adjacent trenches 5 by means of implantation perpendicular to the main area 2 using As at a dose of $5 \times 10^{15}$ $cm^{-2}$ and an energy of 80 keV and a subsequent heat treatment step for dopant activation. A dopant concentration of, for example, $10^{21}$ $cm^{-3}$ is set in the strip-like, doped regions 8. The thin TEOS layer acts as a screen oxide during the implantation (not illustrated).

Figure 4:
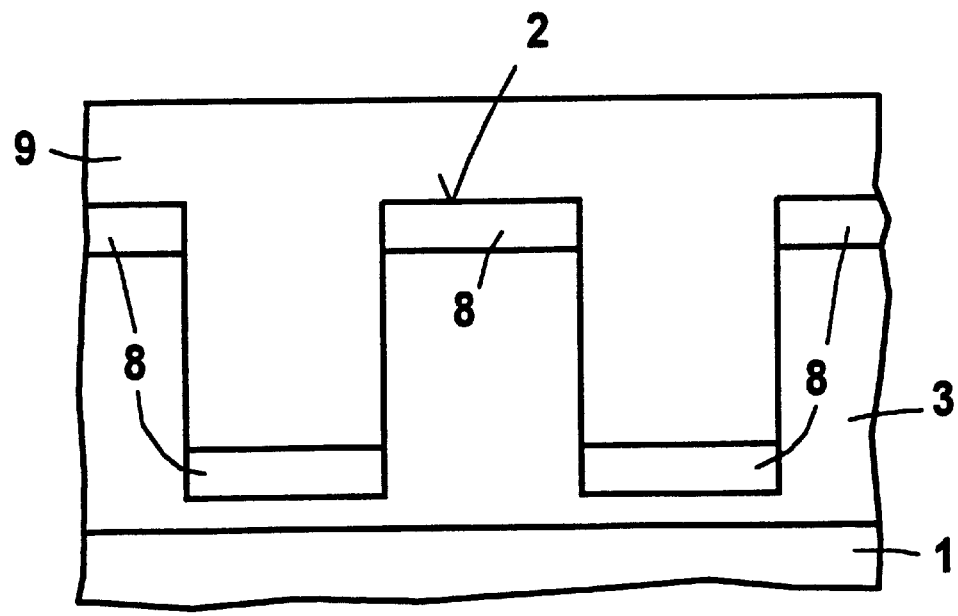
FIG. 4 shows the substrate after the application of an insulating layer.
Figure 5:
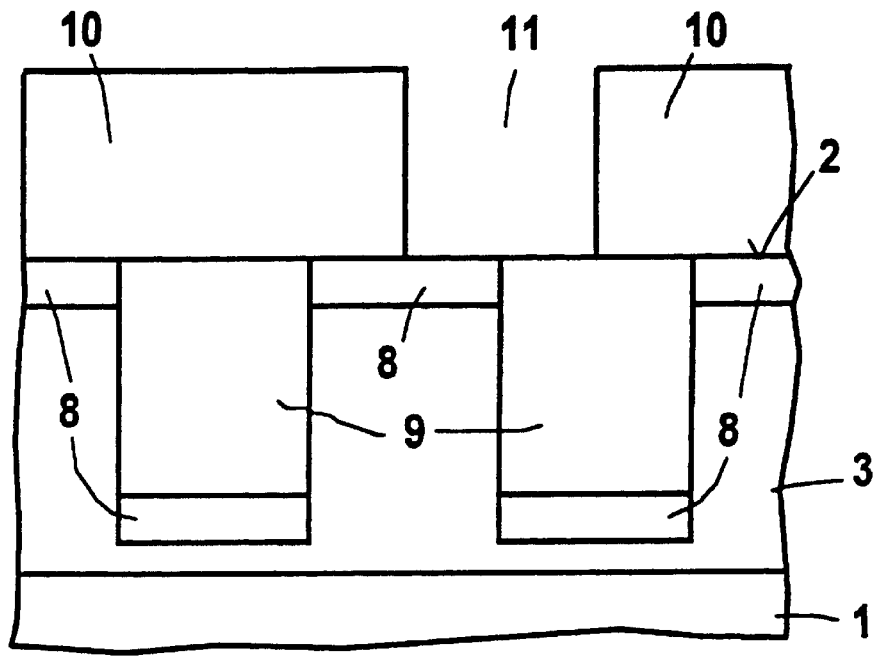
FIG. 5 shows the substrate after the exposure of the main area and the formation of a first mask.

The $SiO_2$ spacers 7 and the $SiO_2$ layer 6 are subsequently removed, for example, by wet-chemical etching using an HF dip. An insulating layer 9 of $SiO_2$ is then deposited, for example, using a TEOS method. The insulating layer 9 is deposited to a layer thickness of 600 nm (see FIG. 4). This layer is etched back in a dry etching method using HBr, $Cl_2$, He, for example. The insulating layer 9 completely fills the trenches 5 (see FIG. 5).

A first mask 10 made, for example, of photoresist is subsequently formed using photolithographic process steps. The mask 10 has first openings 11 in the cell array. The region outside the cell array in which a periphery for the memory cell arrangement is formed, for example, is covered by the first mask 10. The first openings 11 are aligned in such a way that they each overlap at least one side of the trenches 5. The dimensions of the first openings 11 parallel to the main area 2 in each case correspond to the width of the trenches 5. Larger dimensions of the first openings 11 are achieved by the coincidence of adjacent openings. The first mask 10 is aligned in such a way that the first openings 11 are, in each case, arranged such that they overlap the sides of the trenches 5. If the trenches 5 are formed with a width corresponding to the minimum structure size F that can be produced with the respective technology the width being, for example, 0.4 $\mu$m, then the first openings 11 likewise have minimum dimensions of F×F. When aligning the first mask 10, use is made of the fact that the alignment accuracy is, in each case, greater than the smallest structure size F that can be produced with the respective technology. In 0.4 µm technology, the alignment accuracy is, for example, F/3.

The insulating layer 9 is structured using an anisotropic etching method, for example with HBr, $Cl_2$, He. The first mask 10 acts as an etching mask in this case. In this process, the sides of the trenches 5 and the silicon surface on the bottoms of the trenches 5 and on the main area 2 between adjacent trenches 5 are exposed in the region of the first openings 11. Under the first mask 10, on the other hand, the insulating layer 9 is not attacked.

Figure 6:
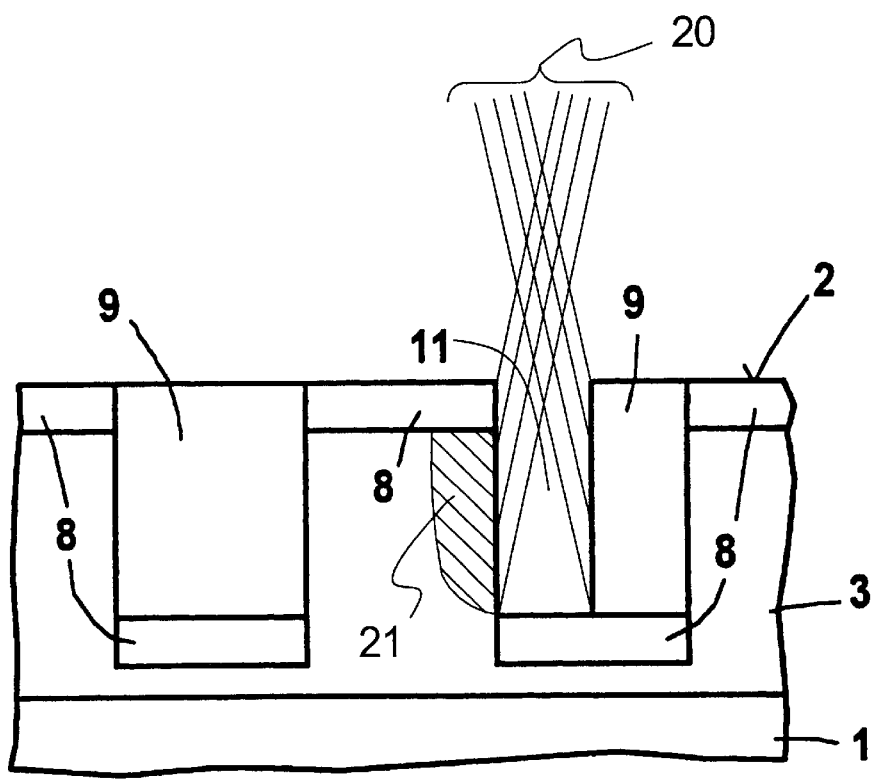
FIG. 6 shows the substrate after the first structuring of the insulating layer.

The mask 10 is removed after the structuring of the insulating layer 9 (see FIG. 6). A thin screen oxide (approximately 10 nm) is subsequently deposited using a TEOS method (not illustrated).

In a first implantation step, two angled implantations 20 are subsequently carried out using boron at a dose of, for example, $7 \cdot 10^{12}$ cm$^{-2}$ and an energy of, for example, 30 keV. In this case, the angle of inclination with respect to the normal of the main area 2 is 20° to 30°, and −20° to −30°. In the process, the exposed sides of the trenches 5 are doped 21. A dopant concentration of, for example, $3 \cdot 10^{17}$ cm$^{-3}$ is set in the exposed sides. Since the doping in the strip-like, doped regions 8 is $10^{21}$ cm$^{-3}$, the implantation of boron can be tolerated in this region.

Figure 7:
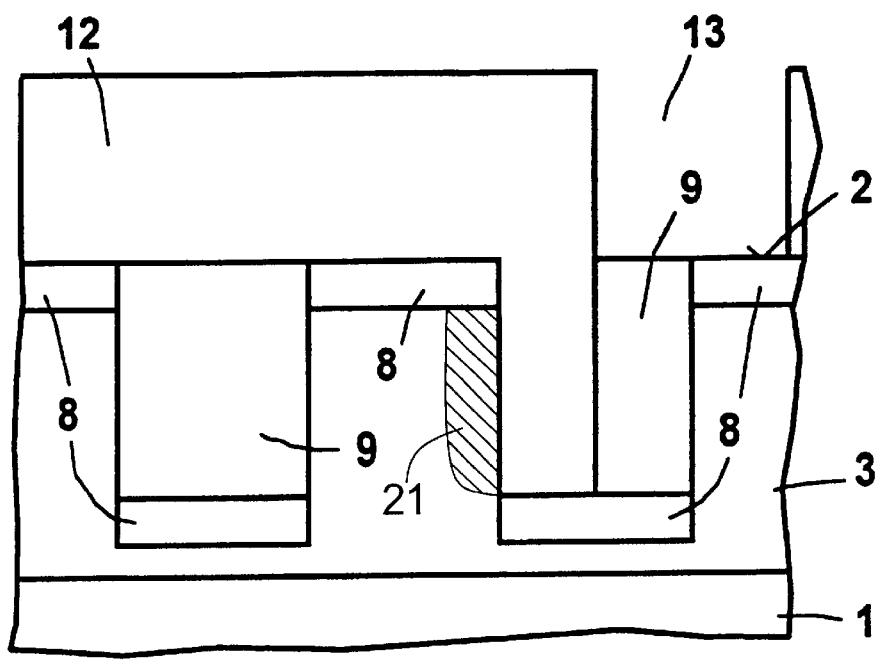
FIG. 7 shows the substrate after the formation of a second mask.

A second mask 12 made, for example, of photo-resist is subsequently formed using photolithographic process steps (see FIG. 7). The second mask 12 has second openings 13 in the cell array. The region outside the cell array in which a periphery for the memory cell arrangement is formed, for example, is covered by the second mask 12. The second openings 13 are aligned in such a way that they each overlap at least one side of the trenches 5. The dimensions and the alignment of the second openings 13 correspond to those of the first openings 11.

The insulating layer 9 is structured using an anisotropic etching method, for example with HBr, $Cl_2$, He. The second mask 12 acts as an etching mask in this case. In the process, the sides of the trenches 5 and the silicon surface on the bottoms of the trenches 5 and on the main area 2 between adjacent trenches 5 are exposed in the region of the second openings 13. Under the second mask 12, on the other hand, the insulating layer 9 is not attacked.

Figure 8:
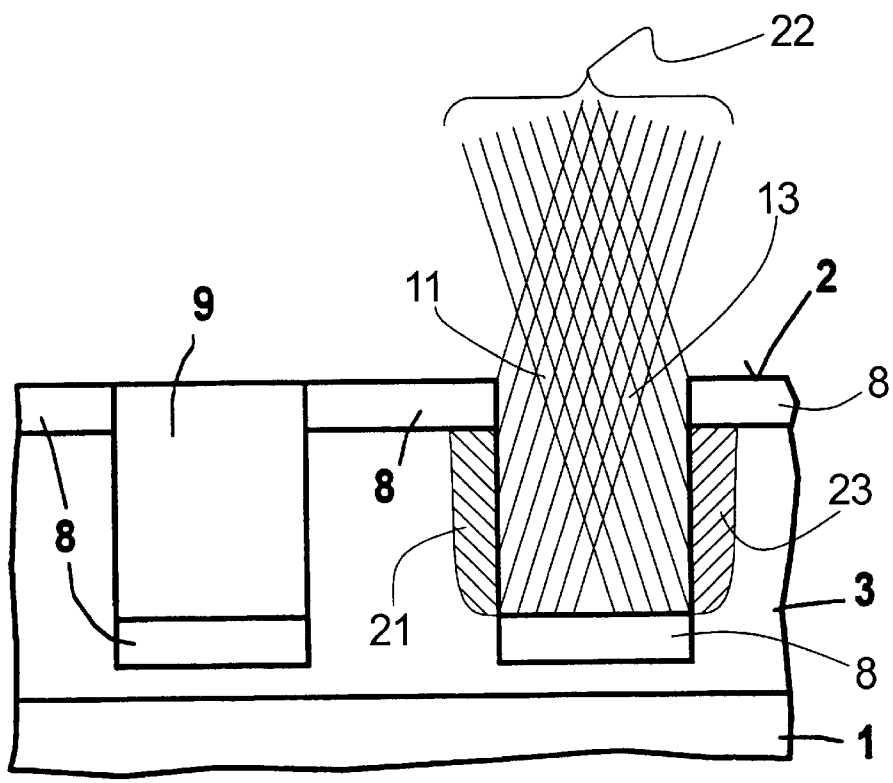
FIG. 8 shows the substrate after the second structuring of the insulating layer.

The second mask 12 is removed after the second structuring of the insulating layer 9 (see FIG. 8). A thin screen oxide (approximately 10 nm) is subsequently deposited using a TEOS method (not illustrated).

In a second implantation step, two angled implantations 22 are subsequently carried out using boron at a dose of, for example, $7 \cdot 10^{12}$ cm$^{-2}$ and an energy of, for example, 30 keV. In this case, the angle of inclination with respect to the normal to the main area 2 is 20° to 30°, and −20° to −30°. In the process, the exposed sides of the trenches 5 are doped at 21 and 23. A dopant concentration of, for example, $3 \cdot 10^{17}$ cm$^{-3}$ is set in the exposed sides in the region 23 of the second openings 13. In the region 21 of the first openings 11, the dopant concentration rises as a result of the second implantation step to, for example, $4 \cdot 10^{17}$ cm$^{-3}$. Since the doping in the strip-like, doped regions 8 is $10^{21}$ cm$^{-3}$, the implantation of boron can be tolerated in this region.

Figure 9:
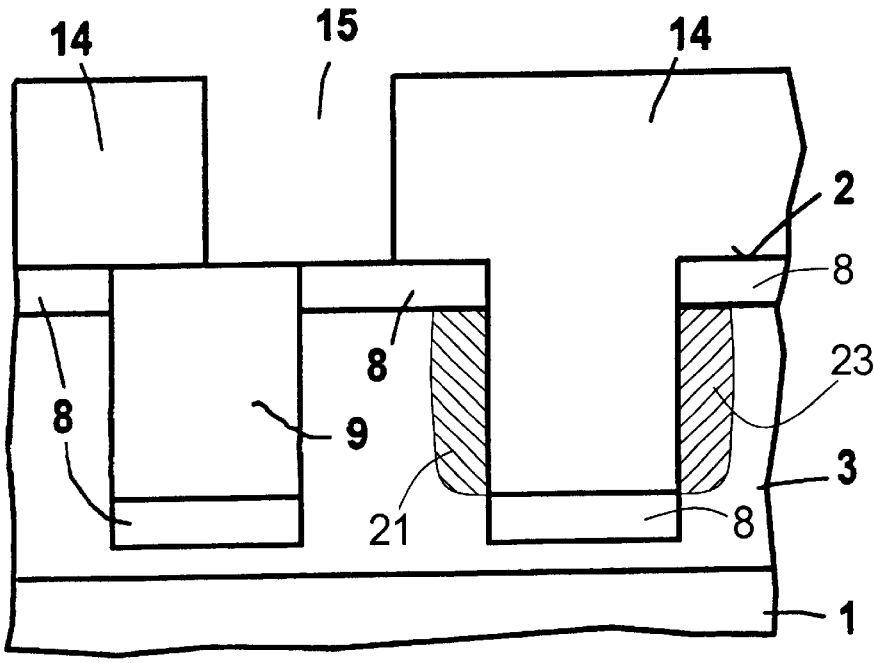
FIG. 9 shows the substrate after the formation of a third mask.

A third mask 14 made, for example, of photoresist is subsequently formed using photolithographic process steps (see FIG. 9). The third mask 14 has third openings 15 in the cell array. The region outside the cell array in which a periphery for the memory cell arrangement is formed, for example, is covered by the third mask 14. The third openings 15 are aligned in such a way that they each overlap at least one side of the trenches 5. The dimensions and the alignment of the third openings 15 correspond to those of the first openings 11 and of the second openings 13.

The insulating layer 9 is structured using an anisotropic etching method, for example, with HBr, $Cl_2$, He. The third mask 14 acts as an etching mask in this case. In the process, the sides of the trenches 5 and the silicon surface on the bottoms of the trenches 5 and on the main area 2 between adjacent trenches 5 are exposed in the region of the third openings 15. Under the third mask 14, on the other hand, the insulating layer is not attacked. Insulation structures 16 remain outside the regions of the first openings 11, of the second openings 13 and of the third openings 15, which insulation structures 15 have an extent corresponding to half the trench width perpendicularly to the side on which they are arranged.

Figure 10:
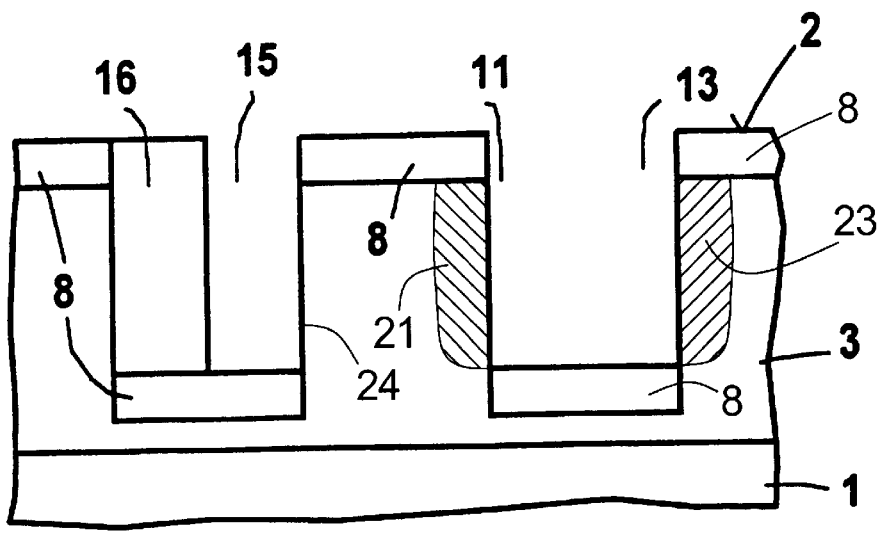
FIG. 10 shows the substrate after the third structuring of the insulating layer.

The third mask 14 is removed after the third structuring of the insulating layer 9 (see FIG. 10). In the region of the third openings 15, the dopant concentration in the sides 24 of the trenches 5 remains at, for example, $2 \cdot 10^{17}$ cm$^{-3}$.

Figure 11:
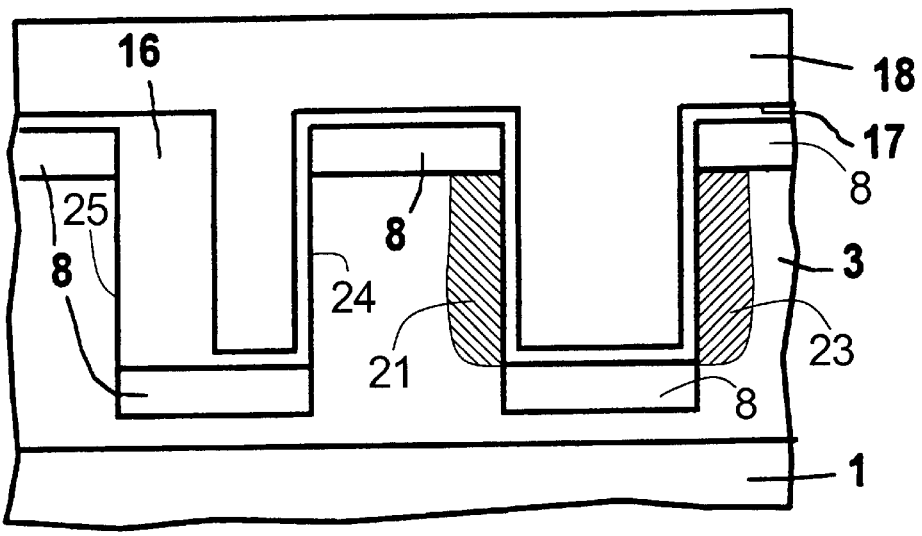
FIG. 11 shows the substrate after the formation of a gate dielectric and word lines which run transversely with respect to the trenches.

The thin TEOS screen oxide is then removed using an HF dip. A gate dielectric 17 is produced on the exposed sides, for example, by thermal oxidation to a layer thickness of, for example, 10 nm (see FIG. 11). An n$^+$-doped polysilicon layer is subsequently applied over the whole area to a layer thickness of 400 nm. This is preferably done by the in situ-doped deposition of polysilicon. As an alternative, the polysilicon layer in deposited in undoped form and is subsequently doped by coating with a POCL layer (POCL stands for $PCl_3$: phosphorus chloride gas). The doped polysilicon layer is structured by anisotropic etching with the aid of photolithographic process steps. This produces word lines 18 which run transversely with respect to the trenches 5 (see FIG. 11 and FIG. 12). The word lines 18 have a width of, for example, F=0.4 µm. The spacing between adjacent word lines 18 is likewise F.

The vertical MOS transistors are, in each case, formed by two strip-like doped regions 8 which adjoin the same side of one of the trenches 5, that part of the well 3 which is arranged in between as channel region, the gate dielectric 17 or the insulation structure 16 and the adjoining part of one of the word lines 18.

The four vertical MOS transistors have four different threshold voltage values. A first threshold voltage value at 25 is determined by the thickness of the insulation structure 16 which acts as gate dielectric of a thick oxide transistor. A second threshold voltage value is determined by the dopant concentration at 21 established by the first and the second implantation step. A third threshold voltage value is determined by the dopant concentration established by the second implantation step. A fourth threshold voltage value is determined by the dopant concentration of the well 3 at 23.

The memory cell arrangement is therefore programmed during the structuring of the insulating layer 9. The information is transmitted into the memory cell arrangement via the arrangement of the first openings 11, of the second openings 13 and of the third openings 15 in the respective masks 10, 12, 14.

The extent of the vertical MOS transistor parallel to the course of the strip-like trenches 5 is given by the width of the word lines 18. MOS transistors which are adjacent along one side of one of the trenches are separated from one another by the spacing between adjacent word lines 18. The strip-like, doped regions 8 in each case run over the entire cell array. They form lines which, depending on the interconnection, are used as a bit line or reference line and interconnect the source/drain regions of MOS transistors which are adjacent along a trench.

As an alternative to the first and second implantation steps, the exposed sides of the trenches 5 are formed by outdiffusion from a doped layer. For this purpose, the first mask 10 and second mask 12 are removed and then a doped layer made, for example, of borosilicate glass is deposited to a layer thickness of 50 nm over the whole area (not illustrated). The sides are doped by out-diffusion in a heat treatment step at, for example, 900°. Prior to the formation of the second mask 12 and of the third mask 14, the doped layer is in each case removed, for example, using an HF dip.

For the purpose of reading out the memory cells, the strip-like, doped regions 8 are used as a bit or reference line. The memory cell to be assessed is selected via the word line. During read-out, the threshold voltage of the respective MOS transistor is assessed.

Figure 12:
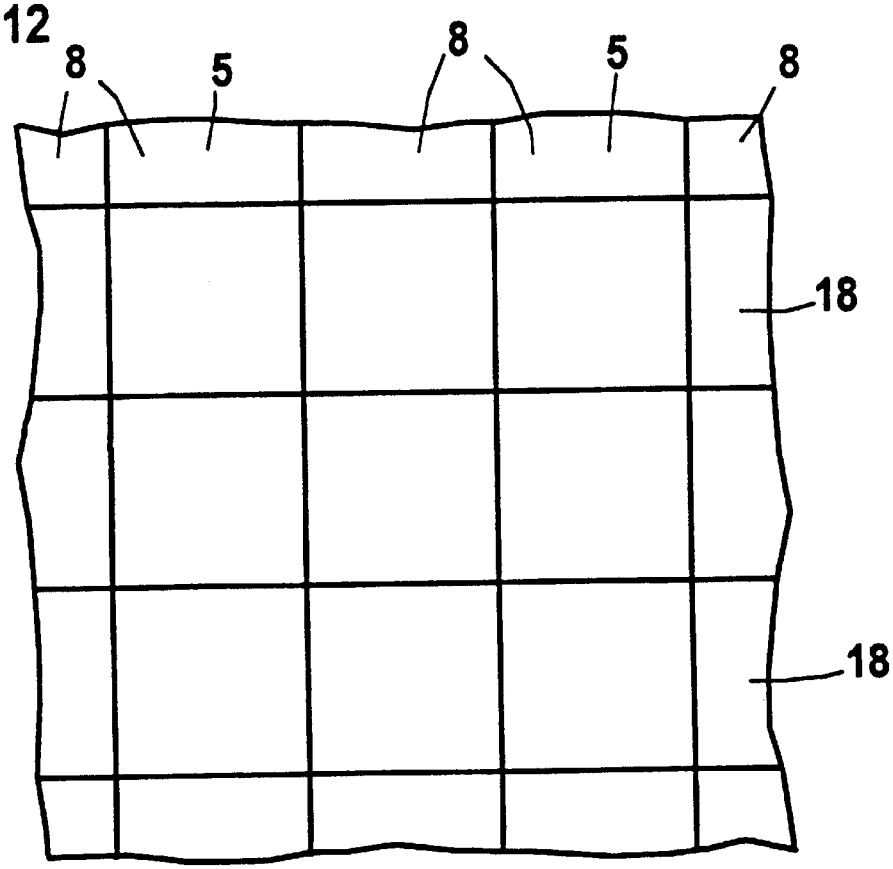
FIG. 12 shows a plan view of the substrate after formation of the word lines.

FIG. 12 illustrates a plan view of the memory cell arrangement. The course of the word lines 18 transversely with respect to the trenches 5 is shown. Also depicted are the strip-like, doped regions 8 which run on the bottom of the trenches 5 and between adjacent trenches 5.

Each memory cell includes a vertical MOS transistor which has an extent of 2 F parallel to the course of the strip-like trenches 5 and an extent of F perpendicular to the course of the strip-like trenches 5. The space requirement for each memory cell is therefore 2 $F^2$.

The production of the memory cell arrangement is concluded by the deposition of an intermediate dielectric, the opening of contact holes and the production of a metallization layer (not illustrated).

Although the present invention has been described with reference to specific embodiments, those of skill in the art will recognize that changes may be made thereto without departing from the spirit and scope of the invention as set forth in the hereafter appended claims.

What is claimed is:

1. A memory cell arrangement, comprising:
   a substrate, at least a main area of the substrate formed of semiconductor material doped by a first conductivity type; and
   a plurality of memory cells provided in the substrate, each memory cell including an MOS transistor positioned vertically with respect to the main area, said MOS transistors of said plurality of memory cells possessing first, second and third threshold voltage values depending upon information stored in the respective memory cell, the first threshold voltage value obtained by a thickness of a gate dielectric of the respective MOS transistor, and the second and third threshold voltage values obtained by different channel dopings of the respective MOS transistors.

2. A memory cell arrangement as claimed in claim 1, further comprising:
   a plurality of substantially parallel strip-like trenches formed in the substrate, the gate dielectric formed on sides of the trenches;
   a plurality of strip-like doped regions formed on bottoms of the trenches and on the main area between adjacent trenches, the doped regions doped by a second conductivity type opposite to the first conductivity type;
   a plurality of substantially parallel word lines running transversely with respect to the trenches; and
   wherein each MOS transistor is formed of two of the doped regions adjoining each of the gate dielectric, one of the word lines and one side of one of the trenches.

3. A memory cell arrangement as claimed in claim 2, wherein a spacing distance between adjacent trenches is equal to a width of the trenches, and a spacing distance between adjacent word lines is equal to a width of the word lines.

* * * * *